(12) United States Patent
Cho et al.

(10) Patent No.: US 12,584,944 B2
(45) Date of Patent: Mar. 24, 2026

(54) TEST SOCKET

(71) Applicant: TSE CO., LTD., Chungcheongnam-do (KR)

(72) Inventors: Hae Guk Cho, Chungcheongnam-do (KR); Yee Sun Kang, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 215 days.

(21) Appl. No.: 18/660,689

(22) Filed: May 10, 2024

(65) Prior Publication Data

US 2024/0385214 A1 Nov. 21, 2024

(30) Foreign Application Priority Data

May 18, 2023 (KR) ......................... 10-2023-0064278

(51) Int. Cl.
G01R 1/04 (2006.01)

(52) U.S. Cl.
CPC .................................. G01R 1/0466 (2013.01)

(58) Field of Classification Search
USPC ...................................................... 324/754.03
See application file for complete search history.

(56) References Cited

U.S. PATENT DOCUMENTS 6,204,680 B1 * 3/2001 Swart ................. G01R 1/06722
324/763.01

FOREIGN PATENT DOCUMENTS

KR 10-2022-0136686 10/2022

* cited by examiner

*Primary Examiner* — Farhana A Hoque

(57) ABSTRACT

The test socket according to the present disclosure is configured to bring terminals of a device under test into contact with electrode pads of a test board, that generates a test signal, to electrically connect the device under test and the tester, the contact part-module configured to allow the contact part to be in an aligned state is separatably coupled to an upper side of the second lower housing of the test socket, so it is possible to easily replace the contact part with new one without separating the test socket from the test board.

10 Claims, 12 Drawing Sheets

< Prior Art >

_130_

< Prior Art >

< Prior Art >

*(a)*

*(b)*

*(c)*

(a)                      (b)

(a)

(b)

(a)

(b)          (c)

(d)

(a)

(b)

(a)

(b)                    (c)

(d)

(a)

(b)                                        (c)

(a)

(b)

TEST SOCKET

CROSS-REFERENCE TO RELATED APPLICATION

This application claims priority of Korean Patent Application No. 10-2023-0064278, filed on May 18, 2023, in the KIPO (Korean Intellectual Property Office), the disclosure of which is incorporated herein entirely by reference.

BACKGROUND OF THE INVENTION

Field of the Invention

The present disclosure relates to a test socket, and more specifically, to a test socket used for electrical testing a device under test.

Description of the Related Art

A device under test (for example, a semiconductor package) is formed by integrating fine electronic circuits with high density, and during a manufacturing process, is subjected to a test process for determining whether each electronic circuit is normal. The test process is a process for testing the device under test to determine whether the device under test is normally operated, and, as a result, distinguishing defect-free products from defective products.

A device under test (for example, a semiconductor package) is formed by integrating fine electronic circuits with high density, and during a manufacturing process, is subjected to a test process for determining whether each electronic circuit is normal. The test process is a process for testing the device under test to determine whether the device under test is normally operated, and, as a result, distinguishing defect-free products from defective products.

In the case of, among the conventional semiconductor packages, a ball grid array (BGA) package that uses solder balls as connection terminals, a test socket has a structure in which a socket pin is embedded in a socket barrel, and is fabricated using molding and mechanical machining. As the socket pin, a pogo pin having its own elasticity has been mainly used.

In general, a pogo pin has a structure in which an upper pin coming into contact with a device under test and a lower pin coming into contact with a tester are disposed at upper and lower portions of a barrel, respectively and a spring is interposed between the upper pin and the lower pin.

As the number of uses of pogo pins is increased, transition and oxidation of tin, which is the main component of balls formed in the device under test, occur, thereby causing problems. If foreign substance is accumulated on the upper pin, contact resistance is increased, thereby deteriorating test accuracy and reliability. If the upper pin is damaged as described above, the conventional pogo pin should be replaced in its entirety, so there is a problem that replacement costs are high.

In order to solve this drawback, the present inventors have invented a test socket to which a socket pin is applied, and have filed as Korean Patent Application No. 10-2021-0042633. In this socket pin, as shown in FIGS. 1 to 3, a socket pin 130 is electrically connected to a barrel by a method in which a second plunger 135, which repeatedly comes into contact with a terminal of a device under test, comes simply into contact with an end of the barrel at the outside of the barrel 131.

The test socket 100 consists of a housing 110, a support plate 120, and a plurality of socket pins 130 supported by the housing 110 and the support plate 120, and each socket pin 130 includes a barrel 131, a first plunger 138 received inside the barrel 131, a second plunger 135 disposed outside the barrel 131, and a spring 132 disposed inside the barrel 131. The barrel 131, the first plunger 138, and the spring 132 may be assembled and provided as an elastic part 150.

The test socket 100 is mounted on a test board 20, which generates a test signal, by a screw coupling method or the like. FIG. 2 exemplarily shows that, in a state in which the socket pin 130 of the test socket is disposed such that the socket pin comes into contact with an electrode pad 21 of the test board generating a test signal, the test socket is mounted to the test board using screws 30.

In the configuration disclosed in the above prior application, as in a conventional test socket pin, the second plunger 135 is inserted into the barrel and is not restricted by the barrel, and an electrical connection state in the housing 110 between the barrel 131 and the second plunger can be maintained in an unconstrained state. Therefore, the process of coupling the second plunger 135 with the barrel 131, which regards as a conventional process, can be omitted, thereby shortening the manufacturing time. In addition, if the second plunger 135 is contaminated or damaged by repeated contact with the terminal of the device under test and its performance is deteriorated, only the second plunger 135 is replaced, and the elastic part 150 in which the barrel 131, the first plunger 138, and the spring 132 are coupled may be re-used, thereby minimizing the waste of parts and reducing maintenance costs.

However, in the conventional test socket, as exemplarily shown in FIG. 3, in order to replace the contaminated or damaged second plunger 135 with new one, the test socket 100 is separated from the test board 20 by unscrewing screws and a coupling between the support plate 120 and a mounting recess 112 formed at a lower portion of the housing 110 should be then released. In addition, after the second plunger is replaced, it is necessary to reassemble the support plate 120 and mount the test socket 100 to the test board 20, so there is a problem that replacing the second plunger 135 takes a lot of time.

In addition, the site where the devices under test, such as semiconductor packages, are tested is usually a place where devices under test are manufactured, so it is not easy to replace the second plunger on site. Therefore, it is necessary to take the test socket separated from the test board out of the test site, to replace the second plunger that needs to be replaced, by the test socket manufacturer, and then to mount the test socket at the site. This causes problems of reducing test efficiency, such as a damage caused by equipment interruption occurring during taking the test socket out of test site, separating test socket, and re-assembling the test socket.

The above-described information disclosed in the background description is provided only for improving the understanding of the background of the present disclosure, and thus may include the information which does not constitute the prior art.

SUMMARY OF THE INVENTION

The present disclosure is conceived to solve the above-described drawbacks, and an object of the present disclosure is to provide a test socket which enables a contact part with a short replacement cycle to be easily replaced, while mounted to a test board.

In order to achieve the above object, a test socket according to the present disclosure is configured to bring terminals of a device under test into contact with electrode pads of a test board, that generates a test signal, to perform an electrical test for the device under test, this test socket may include a first upper housing having first upper housing holes, which are formed therein and correspond to the terminals of the device under test, respectively; a first lower housing having first lower housing holes, which are formed therein and correspond to the first upper housing holes, respectively; a second lower housing having second lower housing holes, which are formed therein and correspond to the first lower housing holes, respectively; and a plurality of socket pins, each of which including an elastic part in which a lower plunger may be elastically supported in a cylindrical barrel body to come into contact with the electrode pad, and a contact part formed as separate part from the elastic part and divided into a first portion capable of coming into contact with the terminal of the device under test and a second portion coming into contact with the elastic part and having a diameter greater than that of the first portion; wherein the elastic part is disposed and supported in the second lower housing hole, and the contact part is disposed and supported in a contact part-module formed by coupling the first lower housing to a lower side of the first upper housing.

The contact part-module may be mounted to the second lower housing.

The first upper housing hole may include a first upper housing lower hole having a diameter allowing the second portion to be inserted thereinto, and a first upper housing upper hole having a diameter which is smaller than that of the second portion and allows the first portion to be inserted thereinto, and the first lower housing hole may have a diameter which is smaller than that of the second portion and allows the barrel body to be inserted thereinto.

The first upper housing hole may have a diameter which is smaller than that of the second portion and allows the first portion to be inserted thereinto, and the first lower housing hole may include a first lower housing upper hole having a diameter allowing the second portion to be inserted thereinto, and a first lower housing lower hole having a diameter which is smaller than that of the second portion and allows the barrel body to be inserted thereinto.

The elastic part may include a protruding ring protruding from the barrel body at a lower end portion of the barrel body, and the elastic part may be disposed and supported in an elastic part-module formed by coupling a second upper housing, which is provided with second upper housing holes corresponding to the second lower housing holes, respectively, to an upper side of the second lower housing.

The contact part-module may be mounted to the elastic part-module.

The second lower housing hole may have a diameter allowing the protruding ring to be inserted thereinto, and the second upper housing hole may have a diameter which is smaller than a diameter of the protruding ring and allows the barrel body to be inserted thereinto.

The elastic part may include a protruding ring protruding from the barrel body at a lower end portion of the barrel body, and the elastic part may be disposed and supported in an elastic part-module formed by coupling a second upper housing, which is provided with second upper housing holes corresponding to the second lower housing holes, respectively, to a lower side of the second lower housing.

The second upper housing hole may have a diameter allowing the protruding ring to be inserted thereinto, and the second lower housing hole may have a diameter which is smaller than that of the protruding ring and allows the barrel body to be inserted thereinto.

The test socket may further include an intermediate housing having intermediate housing holes, each of the intermediate housing holes being formed therein and corresponding to the terminal of the device under test, and the contact part-module may be mounted to an upper side of the intermediate housing, the elastic part-module may be mounted to a lower side of the intermediate housing, and the contact part may come into contact with the elastic part through the intermediate housing hole.

In the test socket according to the present disclosure, since the plurality of contact parts are assembled into the contact part-module and the contact part-module is separatably coupled to the upper side of the second lower housing or the intermediate housing of the test socket, there is an advantage that the contact part-module can be easily separated from the test socket and assembled even in a state in which the test socket is mounted to the test board.

In the test socket according to the present disclosure, in a state in which the test socket is mounted to the test board, the contact part-module is easily separated from the second lower housing, the damaged contact part is replaced with a new one, and the contact part-module is then easily assembled to the second lower housing. Therefore, it is easy to replace the contact part, and the contact part can be replaced immediately at the test site without the need to take the test socket out of the test side to replace the contact part, thereby eliminating the cost occurred by equipment interruption, dramatically shortening the time required for replacement and thus significantly improving the efficiency of the test process.

In the test socket according to the present disclosure, since the contact parts are modularized into the contact part-module and the elastic parts including the lower plungers can be modularized into the elastic part-module, by mounting the contact part-module to the elastic part-module or by coupling the contact part-module and the elastic part-module to the upper and lower sides of the intermediate housing, respectively, the test socket may be easily completed, and as a result, the time for assembling the test socket may be significantly shortened.

In the test socket according to the present disclosure, since the contact parts and the elastic parts are separately modularized, if the spare contact part-module or elastic part-module is prepared in advance, when some of the contact parts or some of the elastic parts are damaged, the module containing the damaged part can be immediately replaced with the spare module and the test can be performed with the test socket having the newly mounted module, so the test downtime can be minimized. In addition, when the part constituting the module is damaged, the damaged part can be replaced with a new one at a separate location and time, thereby greatly improving the efficiency of the testing process.

In the socket pin of the test socket according to the present disclosure, the contact part is provided as a separate part from the barrel, the process of coupling the contact part with the barrel as in the prior art can be omitted, thereby shortening the manufacturing time.

In addition, in the test socket according to the present disclosure, when the contact part of the socket pin is contaminated or damaged due to repeated contact between the contact part and the terminal of the device under test, resulting in deterioration of performance, only the contact part may be replaced, and the elastic part in which the barrel, the lower plunger and the spring are combined, may be reused, thereby minimizing the waste of parts and reducing maintenance cost.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
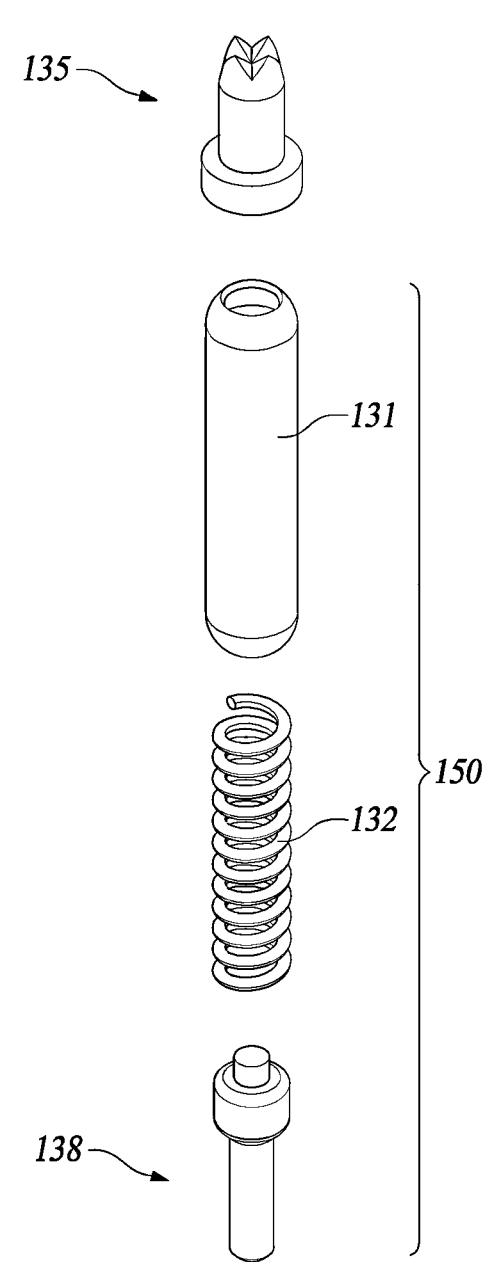
FIG. 1 is an exploded perspective view showing a socket pin of a conventional test socket.
Figure 2:
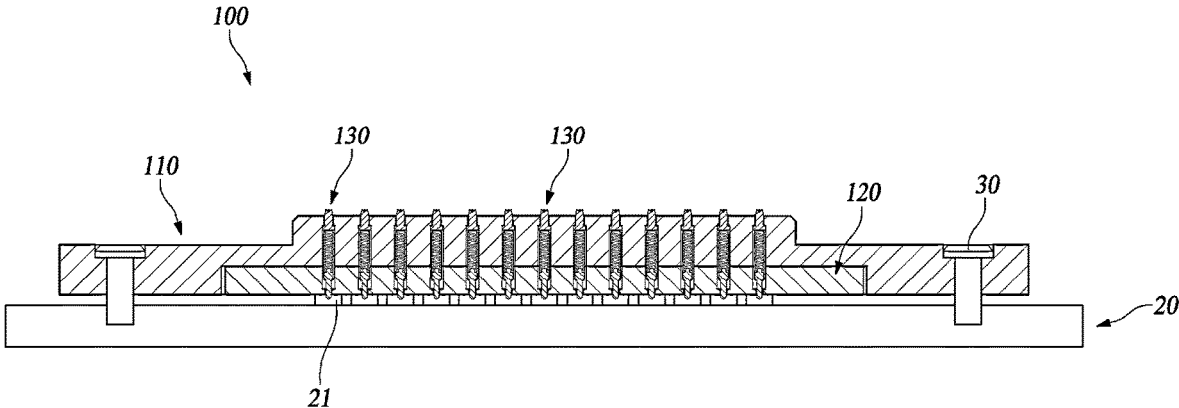
FIG. 2 is a cross-sectional view showing a state in which the conventional test socket is mounted on a test board.
Figure 3:
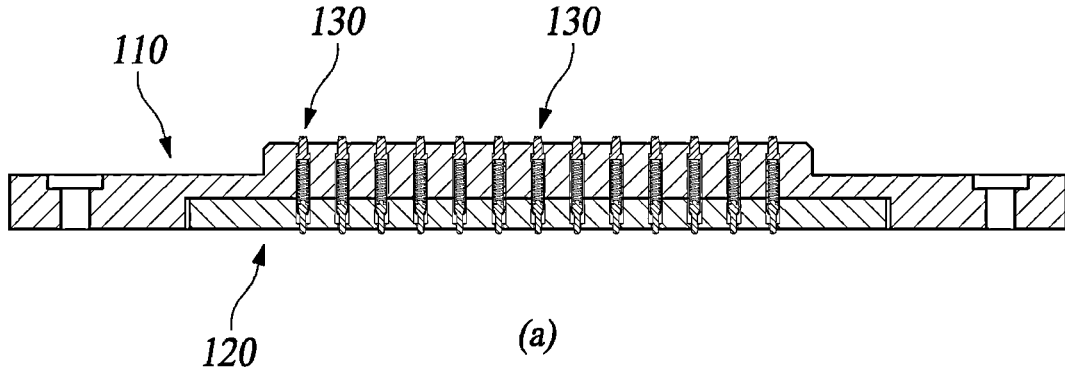
FIG. 3 is a view exemplarily showing the process of replacing the socket pins in the conventional test socket.
Figure 3:
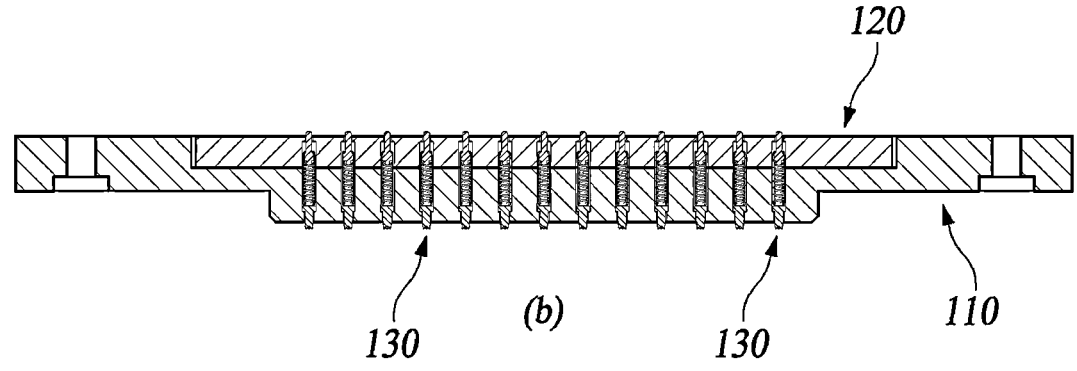
Figure 3:
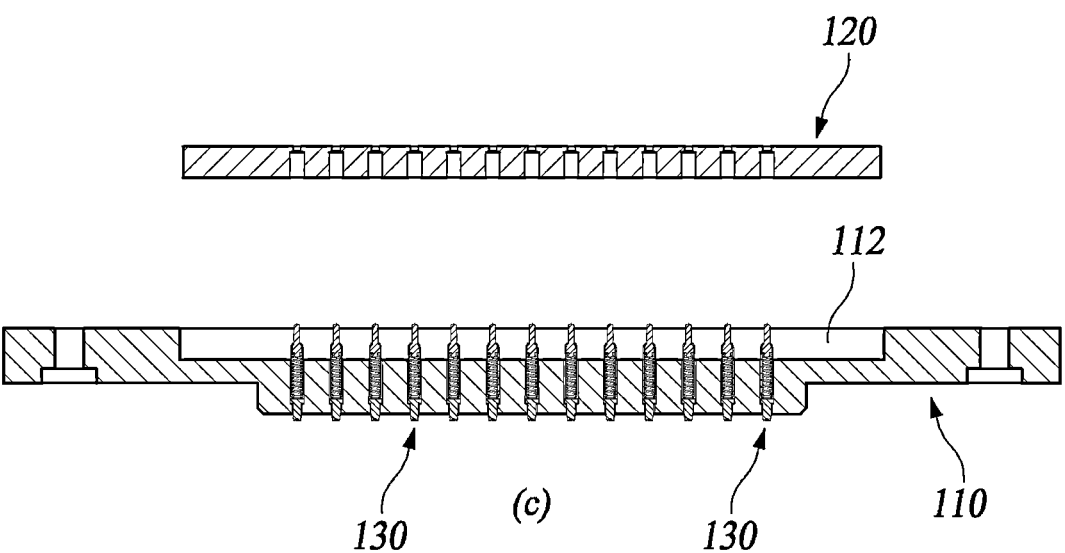

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 4:
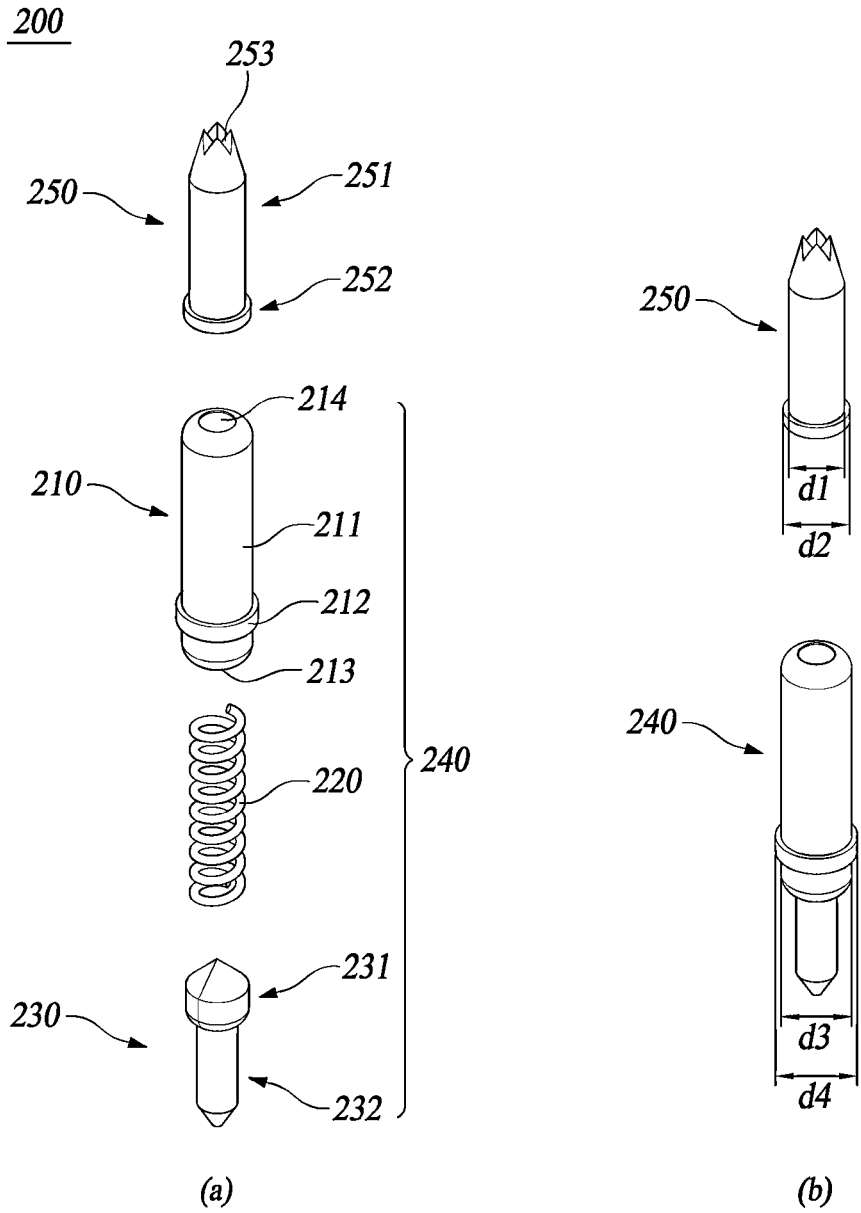
FIG. 4 is an exploded perspective view showing a socket pin of a test socket according to one embodiment of the present disclosure.
Figure 5:
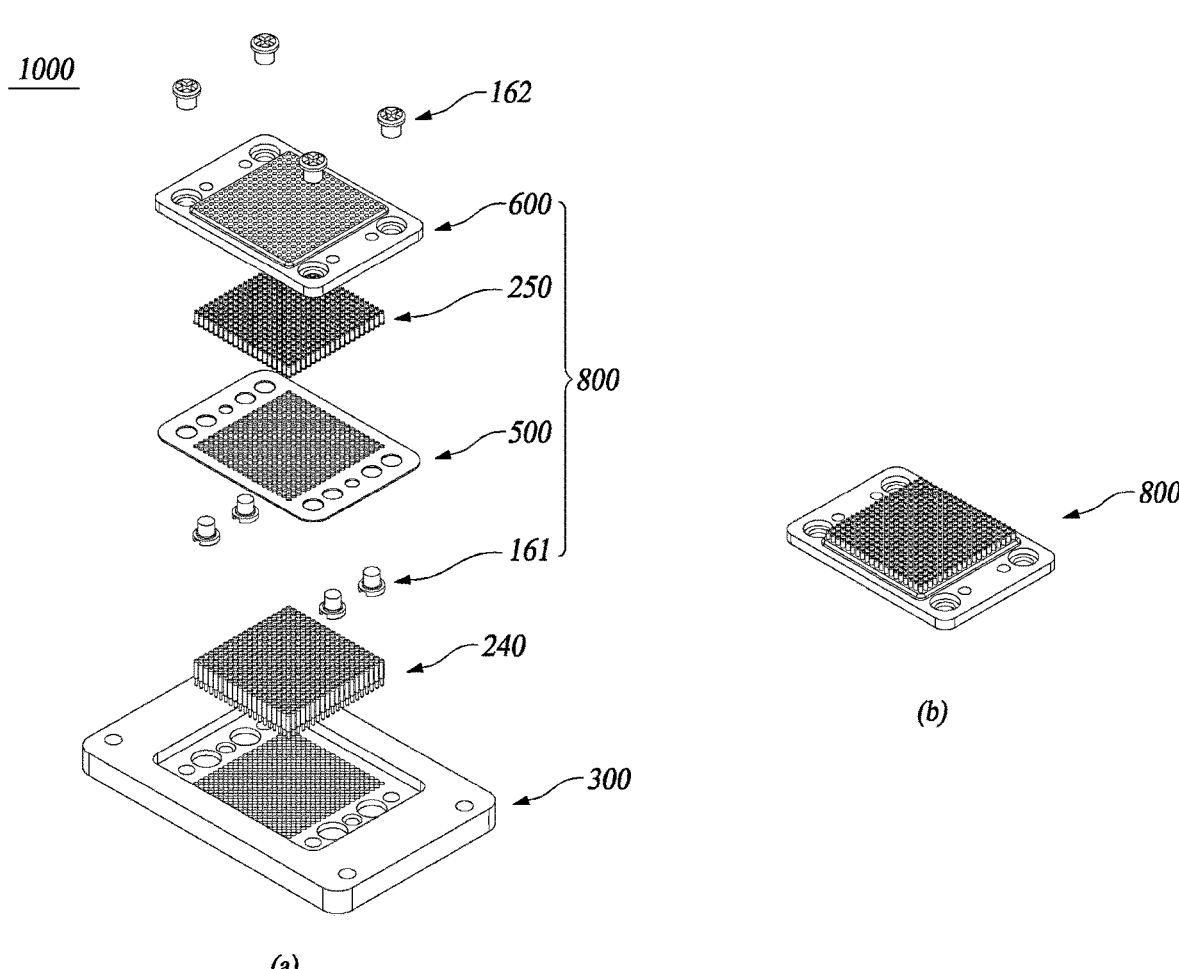
FIG. 5 is an exploded perspective view of the test socket according to the first embodiment of the present disclosure.
Figure 6:
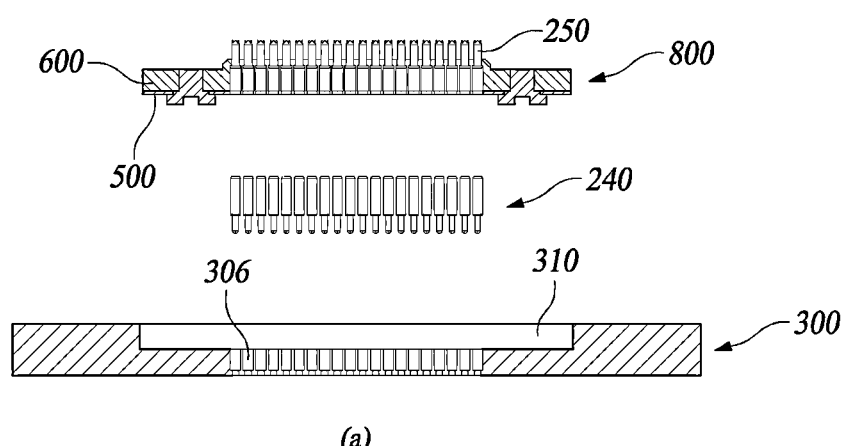
FIG. 6 is a cross-sectional view of the test socket according to the first embodiment of the present disclosure.
Figure 6:
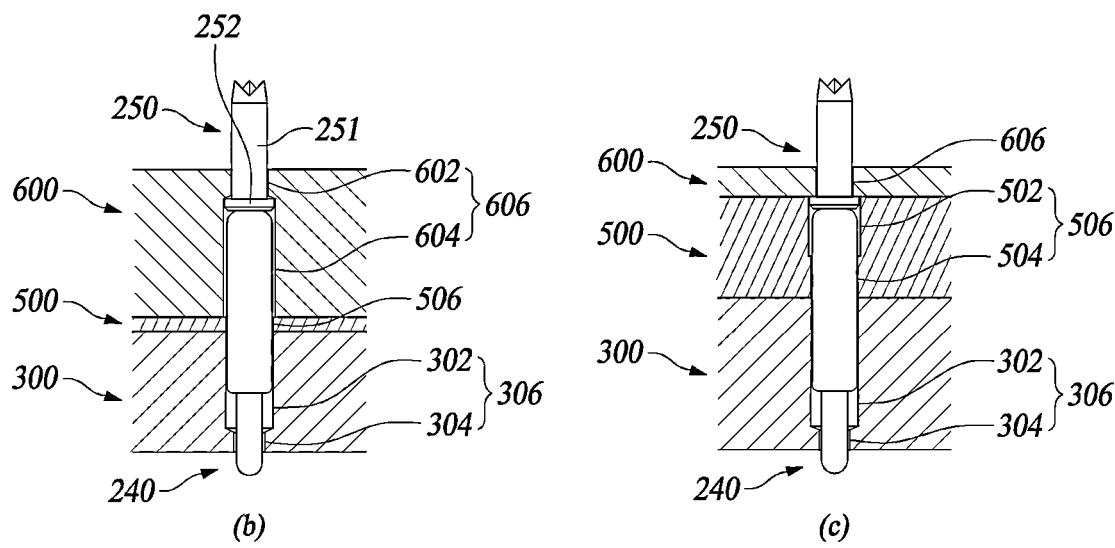
Figure 6:
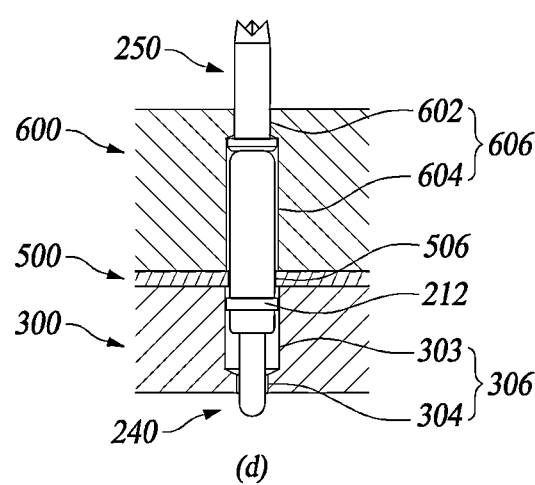
Figure 7:
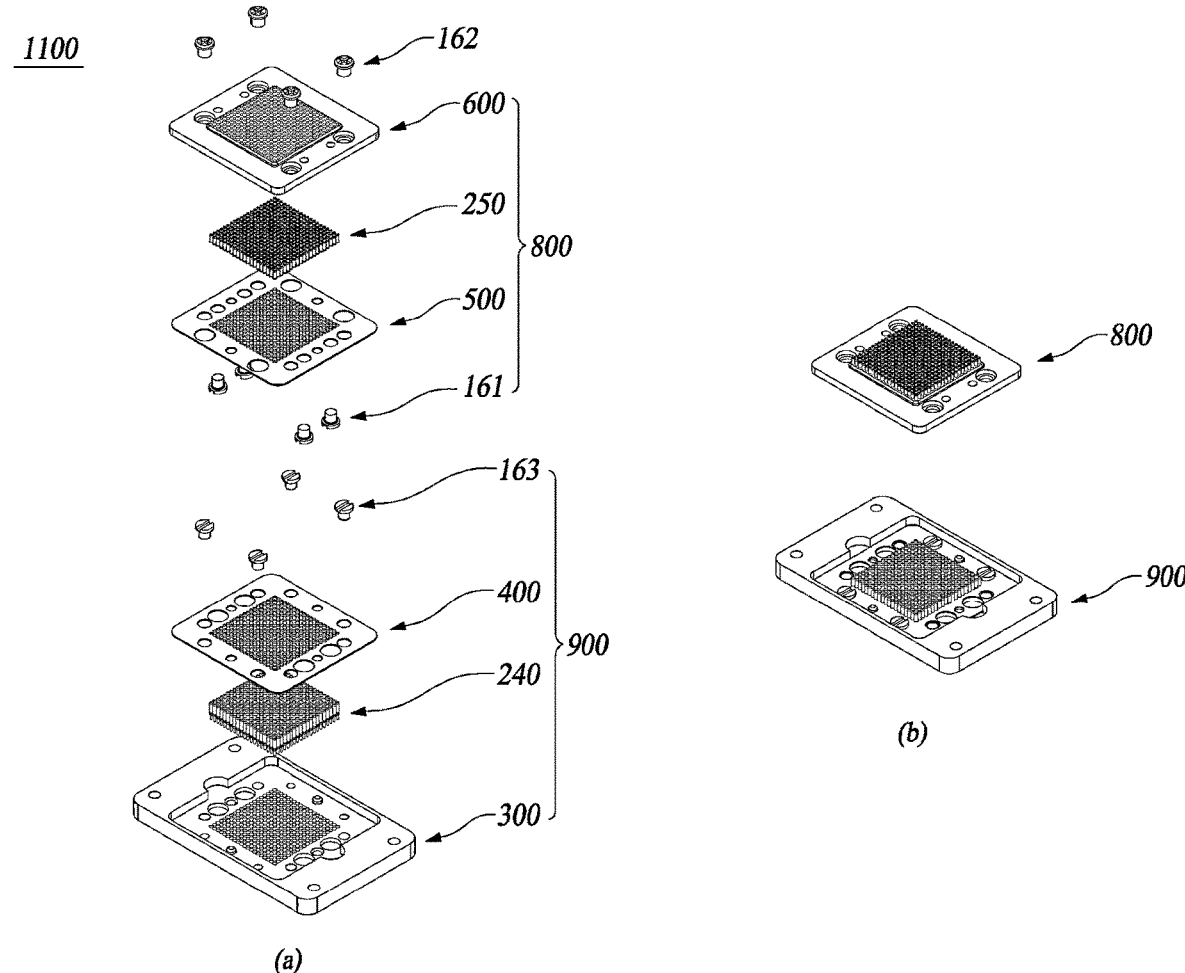
FIG. 7 is an exploded perspective view of the test socket according to the second embodiment of the present disclosure.
Figure 8:
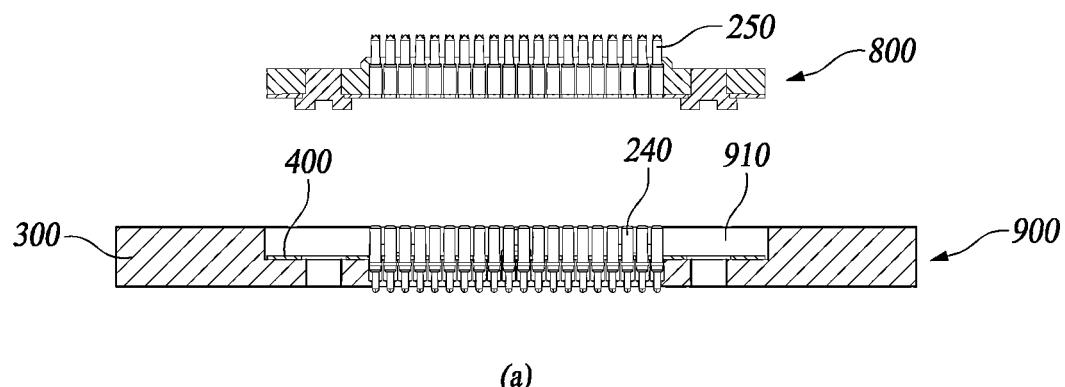
FIG. 8 is a cross-sectional view of the test socket according to the second embodiment of the present disclosure.
Figure 8:
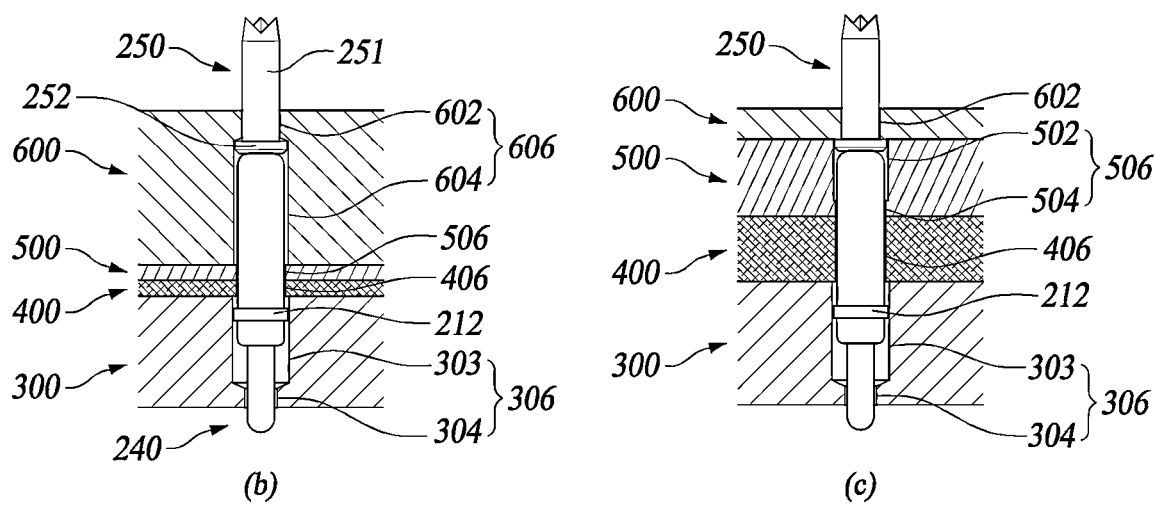
Figure 8:
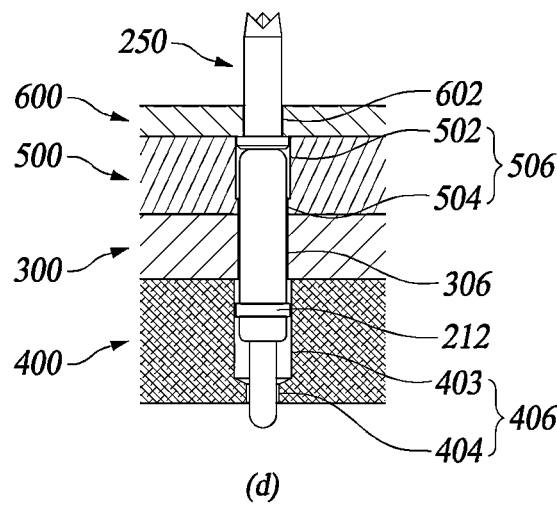
Figure 9:
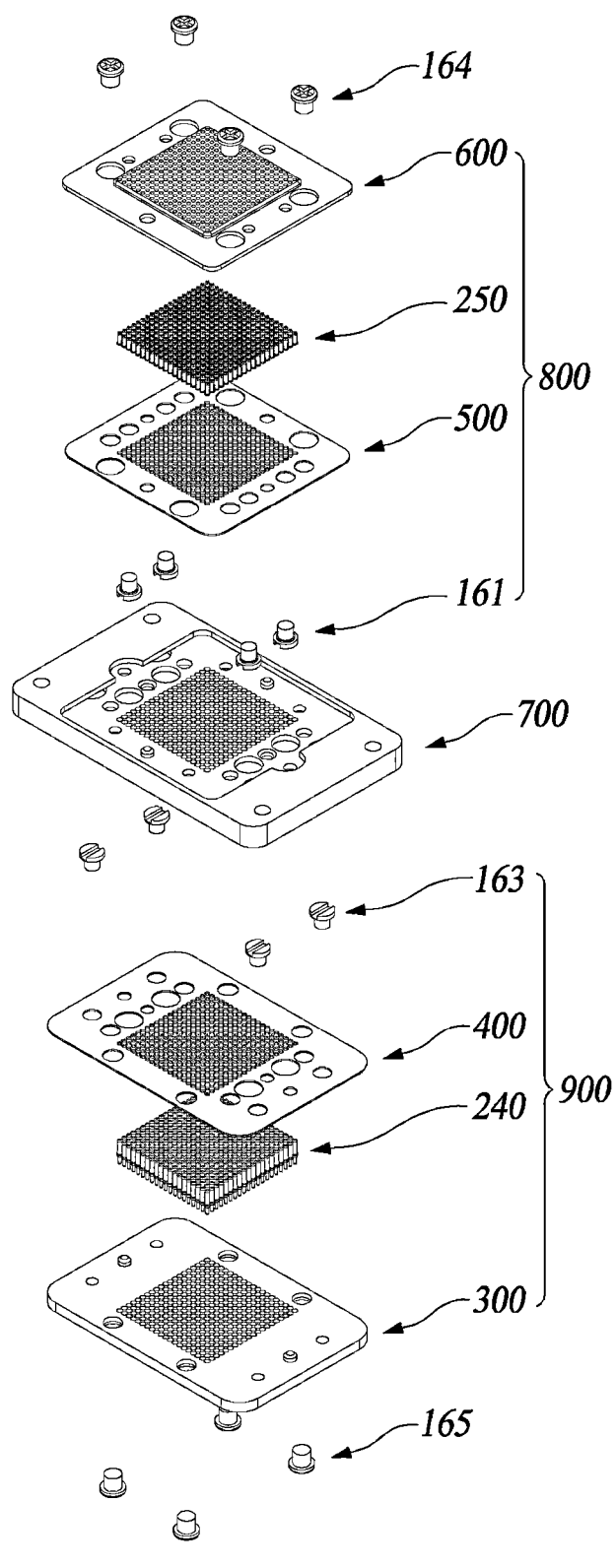
FIG. 9 is an exploded perspective view of the test socket according to the third embodiment of the present disclosure.
Figure 10:
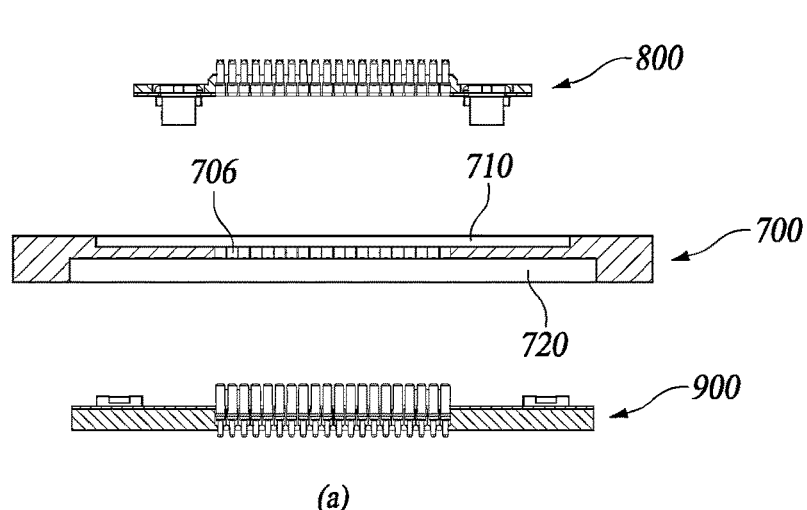
FIG. 10 is a cross-sectional view of the test socket according to the third embodiment of the present disclosure.
Figure 10:
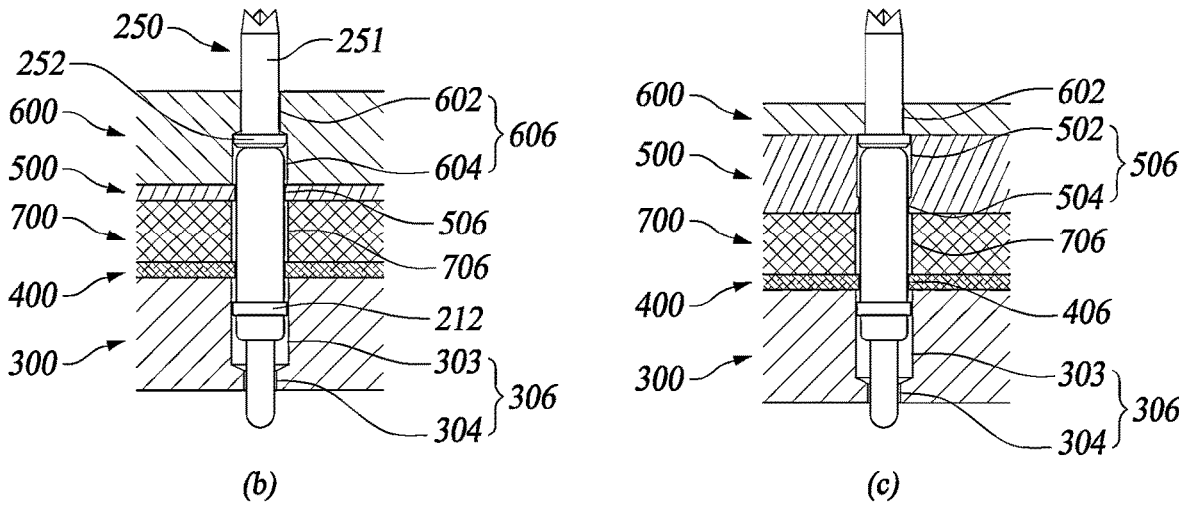
Figure 11:
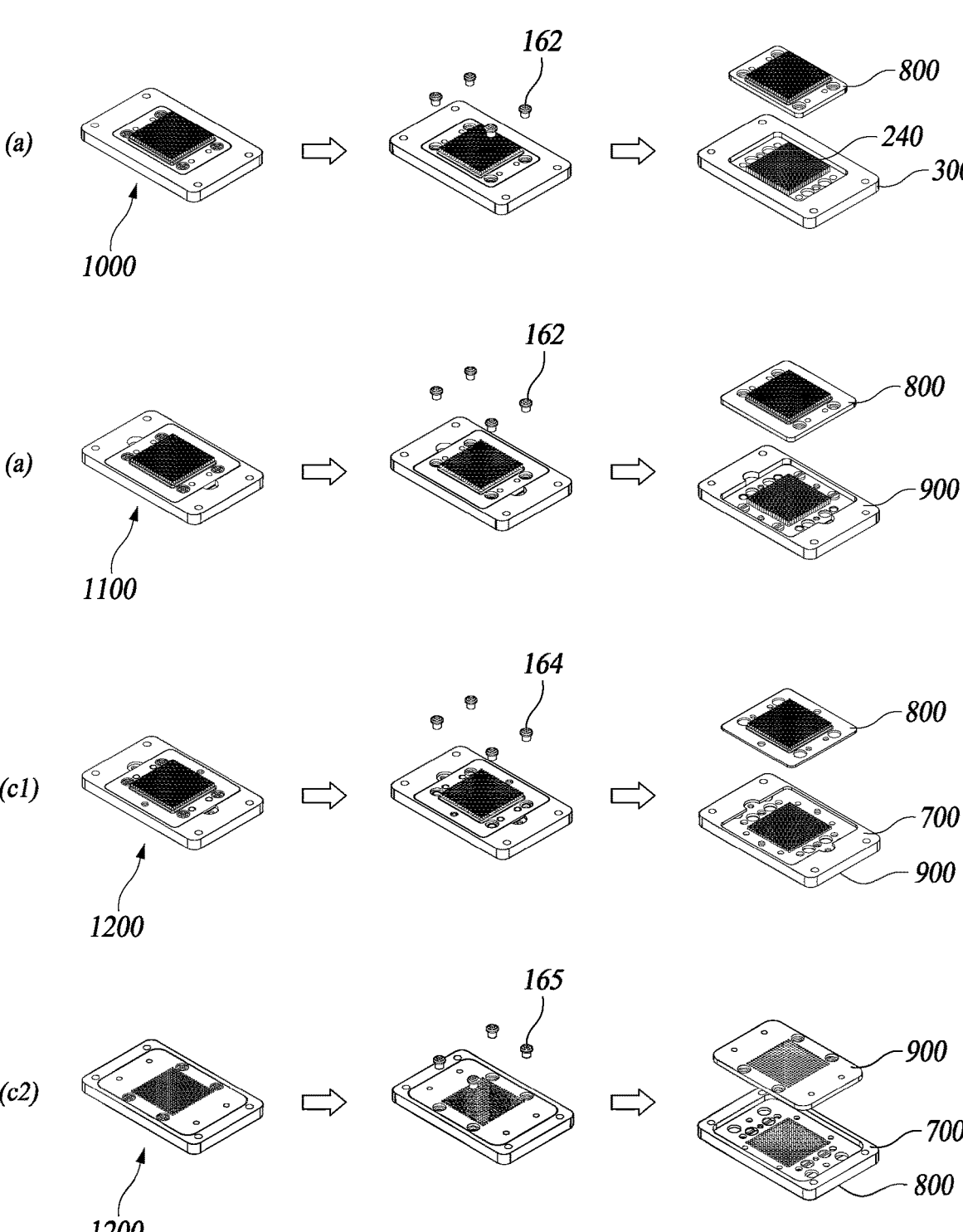
FIG. 11 is a view showing the process of separating a contact part-module from the test socket according to each embodiment of the present disclosure.
Figure 12:
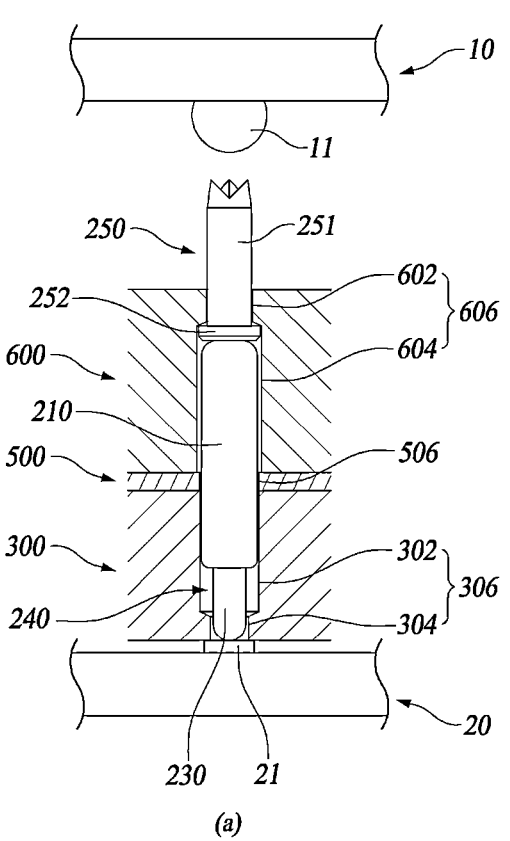
FIG. 12 is a view for describing a method of testing a device under test using the test socket according to the first embodiment of the present disclosure.
Figure 12:
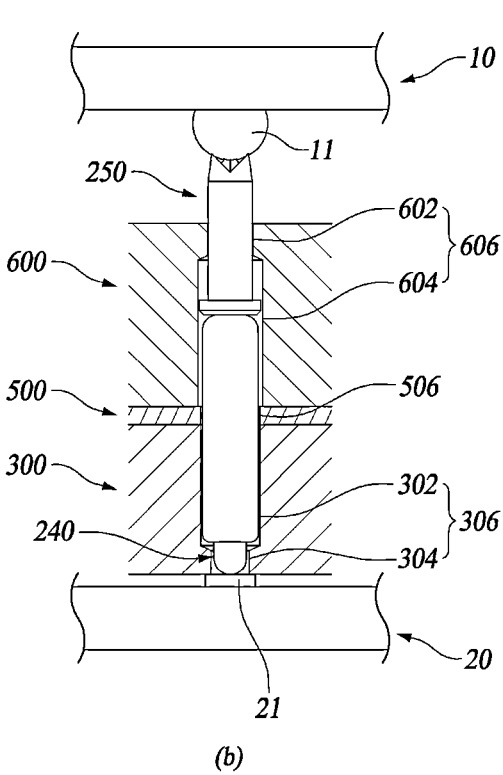

FIG. 4 is an exploded perspective view showing a socket pin of a test socket according to one embodiment of the present disclosure, FIGS. 5 and 6 are views showing the test socket according to the first embodiment of the present disclosure, FIGS. 7 and 8 are views showing the test socket according to the second embodiment of the present disclosure, FIGS. 9 and 10 are views showing the test socket according to the third embodiment of the present disclosure, FIG. 11 is a view showing the process of separating a contact part-module from the test sockets according to each embodiment of the present disclosure, and FIG. 12 is a view for describing a method of testing a device under test using the test socket according to the first embodiment of the present disclosure.

As shown in FIGS. 5 and 6, a test socket 1000 according to the first embodiment of the present disclosure serves to connect terminals 11 of a device 10 under test to electrode pads 21 of a test board 20 that generates a test signal in order to perform an electrical test on the device under test.

The test socket 1000 includes a first upper housing 600 having first upper housing holes 606, which are formed therein and correspond to terminals of a device under test, respectively; a first lower housing 500 having first lower housing holes 506, which are formed therein and correspond to the first upper housing holes, respectively; a second lower housing 300 having second lower housing holes 306, which are formed therein and correspond to the first lower housing holes, respectively; and a plurality of socket pins 200, each of which including an elastic part 240 in which a lower plunger 230 may be elastically supported in a cylindrical barrel body 211 to come into contact with an electrode pad, and a contact part 250 formed as separate part from the elastic part and divided into a first portion 251 capable of coming into contact with the terminal of the device under test and a second portion 252 coming into contact with the elastic part. Here, the second portion 252 has a diameter greater than that of the first portion 251. The elastic part 240 is disposed and supported in the second lower housing hole 306, and the contact part 250 is disposed and supported in a contact part-module 800 formed by coupling the first lower housing 500 to a lower side of the first upper housing 600.

The socket pin 200 may be supported by the first upper housing 600, the first lower housing 500, and the second lower housing 300 to electrically connect the device 10 under test and the test board 20. As shown in FIG. 4, the socket pin 200 includes the elastic part 240 composed of a barrel 210 having the cylindrical barrel body 211, a spring 220 received inside the barrel 210, and the lower plunger 230 having an upper side received inside the barrel 210 to be in contact with the spring and a lower side protruding from the barrel 210 to become contact with the electrode pad 21; and the contact part 250 configured as a separate part from the elastic part 240, and divided into the first portion 251 which can come into contact with the terminal 11 of the device under test and the second portion 252 which comes into contact with an upper end of the elastic part 240.

The barrel 210 may be formed to have only the cylindrical barrel body 211, and may also be configured to have the cylindrical barrel body 211 and a protruding ring 212 formed at a position adjacent to a lower end of the barrel body 211 and protruded outward from the barrel body 211. In this case, a diameter d3 of the barrel body 211 is smaller than a diameter d4 of the protruding ring 212. FIG. 4 depicts the barrel 210 provided with the protruding ring 212 as an example.

The spring 220 and an upper portion of the lower plunger 230 are received inside the barrel 210. A barrel hole 213 is formed at a lower end of the barrel 210, and a plunger contact portion 214, which comes into contact with the contact part 250, is provided at an upper end of the barrel 210. The plunger contact portion 214 may have an opening or may be closed, and may be formed to have another configuration as long as it can improve a contact performance with the contact part 250. The barrel 210 may be made of a copper alloy coated with gold, or another conductive material so as to be capable of transmitting an electrical signal.

An upper side of the lower plunger 230 is received inside the barrel 210 and comes into contact with the spring 220, and a lower side protrudes from the lower end of the barrel 210 through the barrel hole 213 to come into contact with the electrode pad 21 of the test board 20. The lower plunger 230 may be made of a copper alloy coated with gold, or another conductive material so as to be capable of transmitting an electrical signal.

The lower plunger 230 include a head portion 231 coming into contact with the spring 231, and an extension portion 232 extending from the head portion 231 and having a dimeter smaller than that of the head portion 231 so as to be capable of passing through the barrel hole 213. Therefore, the head portion 231 can be moved in a vertical direction while being in contact with the spring 220 inside the barrel 210, and the extension portion 232 protrudes from the lower end of the barrel 210, so an end thereof may be come into contact with the electrode pad 21 of the test board 20. A specific structure of the lower plunger 230 is not limited to that depicted in the drawing, and may be variously modified.

The spring 220 may be received inside the barrel 210 to apply an elastic force to the lower plunger 230 and the contact part 250. A lower end of the spring 220 is in contact with the lower plunger 230 and an upper end is in contact with an inner surface of the barrel 210. The spring 220 directly provides an elastic force to the lower plunger 230 and indirectly provides an elastic force to the contact part 250 via the barrel 210.

The spring 220 and the lower plunger 230 are coupled with the barrel 210 to form the elastic part 240. The elastic part 240 may be provided as a single piece.

The contact part 250 is provided as a separate part from the elastic part 240, an upper side may come into contact with the terminal 11 of the device 10 under test, and a lower side may come into contact with the elastic part 240. The contact part 250 may be made of a copper alloy coated with gold, or another conductive material so as to be capable of transmitting an electrical signal.

The contact part 250 includes the first portion 251 capable of coming into contact with the terminal 11 of the device 10 under test, and the second portion 252 coming into contact with the plunger contact portion 214 placed at an upper end of the elastic part 240. A diameter d2 of the second portion 252 is greater than a diameter d1 of the first portion 251.

A plurality of tip portions 253 that can improve a contact performance with the terminal 11 of the device 10 under test may be provided at an upper end of the first portion 251. The second portion 252 may come into contact with the plunger contact portion 214 of the elastic part 240 to be electrically connected to the elastic part 240. A lower surface of the second portion 252 may be formed to have a flat shape such that it may come stably into contact with the plunger contact portion 214 disposed at the upper end of the elastic part 240. A specific structure of the contact part 250 is not limited to that depicted in the drawing, and may be variously modified.

The second lower housing 300 forms a body of the test socket, and serves to support the plurality of elastic parts 240 such that they are aligned and fixed. A second lower housing-mounting groove 310 may be provided on an upper side of the second lower housing 300, and a contact part-module 800, which will be described later, is mounted in this second lower housing-mounting recess 310.

The plurality of second lower housing holes 306 into which the elastic parts 240 are inserted, respectively, are formed in the second lower housing 300 to pass through the second lower housing 300 in a thickness direction. These second lower housing holes 306 are formed so as to correspond to the terminals 11 of the device under test, respectively.

Each of the second lower housing holes 306 includes second lower housing upper holes 302 and 303 extending from an upper surface of the second lower housing 300 towards the inside of the second lower housing 300, and a second lower housing lower hole 304 being in communication with the second lower housing upper hole 302 and extending towards a lower surface of the second lower housing 300.

As shown in (b) and (c) of FIG. 6, if when the elastic part 240 does not have the protruding ring 212, the second lower housing upper hole 302 has a diameter allowing the barrel body 211 to be inserted thereinto, thereby enabling the barrel body 211 to be moved in a vertical direction in the second lower housing upper hole 302, the second lower housing lower hole 304 is formed to be smaller than a diameter of the second lower housing upper hole 302, but has a diameter allowing the extension portion 232 of the lower plunger 230 to be inserted thereinto, thereby enabling the extension portion 232 of the lower plunger 230 to come into contact with the electrode pad 21 of the test board 20 through the second lower housing lower hole 304.

As shown in (d) of FIG. 6, when the elastic part 240 having the protruding ring 212 is employed, the second lower housing upper hole 303 is formed to have a diameter allowing the protruding ring 212 of the barrel to be inserted thereinto, thereby enabling the protruding ring 212 of the elastic part 240 to be moved in a vertical direction only in the second lower housing upper hole 303.

The contact part-module 800 is a module mounted on the upper side of the second lower housing 300 and serves to support the plurality of elastic parts 240 such that they are aligned and fixed. The contact part-module 800 includes the first upper housing 600, the plurality of contact parts 250, and the first lower housing 500.

The first upper housing 600 is provided with the first upper housing holes 606 in which some of the contact parts 250 are disposed, respectively. The first upper housing holes 606 are formed to correspond to terminals 11 of the device under test, respectively, and are formed to pass through the first upper housing 600 in a thickness direction.

The first lower housing 500 is disposed below the first upper housing 600 and serves to support the contact parts 250 to prevent the contact parts from being deviated. In the first lower housing 500, the first lower housing holes 506 are formed to correspond to the first upper housing holes 606, respectively, and to pass through the first lower housing 500 in a thickness direction.

In a state in which each of the contact parts 250 is inserted into the first upper housing hole 606 and the first lower housing hole 506 which correspond to each other, the first upper housing 600 and the first lower housing 500 are coupled with each other to constitute the contact part-module 800. (b) of FIG. 5 shows the contact part-module 800 in which the contact parts are disposed.

The contact part-module 800 may be constituted in a following manner: In a state in which the first upper housing 600 is turned over, the contact parts 250 are inserted into the first upper housing holes 606, respectively, the first lower housing 500 is placed to allow the first lower housing holes 506 to correspond to the first upper housing holes 606, respectively, and the first lower housing 500 is then coupled to the first upper housing 600 using screws or the like. The first upper housing 600 and the first lower housing 500 may be coupled to each other in various ways, such as a snap-fit method, a fitting method, a screw coupling method, or the like. FIG. 5 exemplarily shows that the first lower housing 500 is fastened to the first upper housing 600 using screws 161.

In the contact part-module 800, the contact part 250 may be disposed such that the second portion 252 of the contact part can be moved in the first upper housing hole 606 or can be moved in the first lower housing hole 506.

(b) and (d) of FIG. 6 depict that the contact part 250 is disposed such that the second portion 252 of the contact part can be moved in the first upper housing hole 606.

As shown in (b) and (d) of FIG. 6, the first upper housing hole 606 includes a first upper housing upper hole 602 extending from an upper surface of the first upper housing 600 towards the inside of the first upper housing, and a first upper housing lower hole 604 being in communication with the first upper housing upper hole and extending towards a lower surface of the first upper housing.

The first upper housing lower hole 604 has a diameter allowing the second portion 252 of the contact part to be inserted thereinto, and the first upper housing upper hole 602 has a diameter which is smaller than a diameter of the second portion 252 of the contact part and allows the first portion 251 to be inserted thereinto.

In addition, the first lower housing hole 506 is formed to have a diameter which is smaller than the diameter of the second portion 252 of the contact part 250 and allows the barrel body 211 of the elastic part to be inserted thereinto.

Therefore, the second portion 252 of the contact part 250 cannot be moved to the first upper housing upper hole 602 and the first lower housing hole 506, may be moved only in the first upper housing lower hole 604 in a vertical direction, and may come into contact with the elastic part 240.

When the elastic part does not have a protruding ring as shown in (b) of FIG. 6, the first lower housing hole 506 and the second lower housing upper hole 302 may be formed to have the same diameter.

When the elastic part is provided with the protruding ring 212 as shown in (d) of FIG. 6, the first lower housing hole 506 may be formed to have a diameter which allows the barrel body 211 of the elastic part to be inserted thereinto, but which is smaller than a diameter of the protruding ring 212 to enable the protruding ring 212 of the elastic part to be moved only in the second lower housing upper hole 302 in a vertical direction. Therefore, in this case, the first lower housing hole 506 is formed to have a diameter smaller than a diameter of the second lower housing upper hole 302.

(c) of FIG. 6 shows that the contact part 250 is arranged such that the second portion 252 of the contact part can be moved in the first lower housing hole 506.

As shown in (c) of FIG. 6, the first upper housing hole 606 is formed to have a diameter which is smaller than a diameter of the second portion 252 of the contact part 250 and allows the first part 251 to be inserted thereinto.

The first lower housing hole 506 includes a first lower housing upper hole 502 extending from an upper surface of the first lower housing 500 towards the inside of the first lower housing, and a first lower housing lower hole 504 being in communication with the first lower housing upper hole and extending towards a lower surface of the first lower housing.

The first lower housing upper hole 502 has a diameter allowing the second portion 252 of the contact part to be inserted thereinto, and the first lower housing lower hole 504 has a diameter which is smaller than a diameter of the second portion 252 of the contact part and allows the barrel body 211 of the elastic part to be inserted thereinto.

Therefore, the second portion 252 of the contact part cannot be moved to the first upper housing hole 606 and the first lower housing lower hole 504, can be moved only in the first lower housing upper hole 502 in a vertical direction, and may come into contact with the elastic part 240.

In this case, it is also possible to form the first lower housing hole 506 and the second lower housing upper hole 302 to have the same diameter.

As shown in (a) of FIG. 6, the contact part-module 800 may be mounted in the second lower housing-mounting recess 310 of the second lower housing 300 where the elastic part 240 is disposed.

In a state in which the elastic part 240 is received the second lower housing hole 306 of the second lower housing, the corresponding elastic part 240 is inserted into the first lower housing hole 506 of the contact part-module 800, the contact part-module 800 is placed in the second lower housing mounting recess 310, and the contact part-module 800 may be then mounted on the second lower housing 300 using screws or the like. By mounting the contact part-module 800 to the second lower housing 300, the test socket 1000 according to the first embodiment is completed.

The contact part-module 800 and the second lower housing 300 may be coupled to each other in various ways, such as a snap-fit method, a fitting method, a screw coupling method, or the like. FIG. 5 exemplarily shows that the contact part-module 800 is fastened to the second lower housing 300 using screws 162.

If the contact part-module 800 is coupled to the second lower housing 300 using a snap-fit method or a fitting method, since the contact part-module 800 can be separated from the second lower housing 300 in an one-touch separating fashion, there is an advantage to being able to easily separate the contact part-module 800 from the second lower housing 300.

As shown in FIG. 12, the test socket 1000 on which the socket pins 200 are disposed may perform a test for the device under test.

The test socket 1000 is mounted on the test board 20 so that the plurality of lower plungers 230 come into contact with the plurality of electrode pads 21 provided on the test board 20. Please note that, in FIG. 12, only one terminal 11, one lower plunger 230 and one electrode pad 21 are shown. In the process of the electrical test for the device 10 under test, the device 10 under test approaches the test socket, so the terminal 11 of the device 10 under test comes into contact with the first portion 251 of the contact part 250. The terminal 11 of the device 10 under test may be brought into close contact with the first portion 251 at a predetermined pressure.

When the terminal 11 of the device 10 under test is in close contact with the contact part 250, the pressure applied to the contact part 250 is transmitted to the barrel 210 and the lower plunger 230, so the spring 220 is compressed. In addition, in a state in which the lower plunger 230 is stationary, the contact part 250 and the barrel 210 are pushed towards the test board 20. Due to an elastic force of the spring 220, at this time, a contact state between the lower plunger 230 and the electrode pad 21 of the test board 20 is stably maintained and a contact state between the first portion 251 of the contact part 250 and the terminal 11 may be stably maintained. Therefore, the terminal 11 of the device 10 under test is electrically connected to the electrode pad 21 of the test board 20 through the contact part 250, the barrel 210 and the lower plunger 230 of the socket pin 200. At this time, a test signal generated from the test board 20 is transmitted to the device 10 under test through the socket pin 200, so an electrical test on the device 10 under test can be performed.

As the test socket is used multiple times, the contact part 250 is contaminated or damaged due to repeated contact between the contact part of the socket pin 200 and the terminal 11 of the device 10 under test, as a result, performance of the socket pin is degraded, so the socket pin may be used after replacing the damaged or contaminated contact part 250. Since the contact part 250 is provided as a separate part independent from the elastic part 240, the elastic part 240 is used as is and only the damaged contact part 250 may be replaced.

In the test socket 1000 according to the first embodiment of the present disclosure, the contact part 250 may be replaced without separating the test socket from the test board in a state in which the test socket is mounted to the test board 20. (a) of FIG. 11 shows a method of replacing the contact part in a state in which the test socket is mounted to the test board.

In (a) of FIG. 11, the test socket 1000 is mounted to the test board (not shown). In the test socket mounted to the test board as above, the contact part-module 800 is separated from the second lower housing 300. As described above, the contact part-module 800 is coupled to the second lower housing 300 using a snap-fit method, a fitting method, a screw coupling method, or the like. If the contact part-module 800 is coupled to the second lower housing 300 by a snap fit method or a fitting method, the contact part-module may be simply separated in an one-touch separating fashion, and if the contact part-module is coupled to the second lower housing by a screw coupling method, the contact part-module may be can be easily separated by unscrewing the screws 162.

After separating the contact part-module 800 from the second lower housing 300, the contact part-module can be disassembled in a reverse order of assembling the contact part-module 800 described above. That is, the contact part-module 800 is turned over and the first lower housing 500 is then separated from the first upper housing 600. For example, if the first lower housing 500 and the first upper housing 600 are coupled to each other using the screws, they may be separated from each other by unscrewing the screws 161, and if they are coupled to each other by a clip fastening method, they are separated from each other by loosening the clip. Since the contact part 250 is aligned in the first upper housing hole 606 of the turned over first upper housing 600, it is possible to replace the contact part 250, that is contaminated or damaged and requires replacement, with a new one. That is, it is possible to replace the contact part 250 with a new one even when the test socket 1000 is coupled to the test board 20. After replacing the contact part 250, a new contact part can be assembled in a reverse order of separating.

In the test socket 1000 according to the first embodiment of the present disclosure, since the plurality of contact parts 250 are assembled into the contact part-module 800 and the contact part-module 800 is separatably coupled to the upper side of the second lower housing 300 of the test socket, there is an advantage that the contact part-module 800 can be easily separated from the test socket and assembled even in a state in which the test socket is mounted to the test board.

In the test socket 1000 according to the first embodiment of the present disclosure, in a state in which the test socket is mounted to the test board 20, the contact part-module 800 is easily separated from the second lower housing 300, the damaged contact part is replaced with a new one, and the contact part-module 800 is then easily assembled to the second lower housing 300. Therefore, it is easy to replace the contact part, and the contact part can be replaced immediately at the test site without the need to take the test socket out of the test side to replace the contact part, thereby eliminating the cost occurred by equipment interruption, dramatically shortening the time required for replacement and thus significantly improving the efficiency of the test process.

In the socket pin 200 for the test socket 1000 according to the first embodiment of the present disclosure, since the contact part 250 is provided as a separate part from the barrel 210, the process of coupling the contact part 250 with the barrel 210 as in the prior art can be omitted, thereby shortening the manufacturing time.

In addition, in the test socket 1000 according to the first embodiment of the present disclosure, when the contact part 250 of the socket pin 200 is contaminated or damaged due to repeated contact between the contact part and the terminal 11 of the device 10 under test, resulting in deterioration of performance, only the contact part 250 may be replaced, and the elastic part 240 in which the barrel 210, the lower plunger 230 and the spring 220 are combined, may be reused, thereby minimizing the waste of parts and reducing maintenance cost.

FIGS. 7 and 8 depict a test socket 1100 according to the second embodiment of the present disclosure.

As compared with the test socket 1000 of the first embodiment, the test socket 1100 of the second embodiment shown in FIGS. 7 and 8 different only in that an elastic part-module 900 is applied, and the contact part-module 800 is the same as that of the first embodiment. Therefore, the same reference numbers are used for the same components as those in the first embodiment, and the description thereon is omitted.

The elastic part-module 900 includes the second lower housing 300, a second upper housing 400, and the elastic part 240 provided with the protruding ring 212 protruding from the barrel body at a lower end of the barrel body 211.

The second lower housing 300 is provided with a second lower housing hole 306 having a diameter allowing the protruding ring 212 of the elastic part to be inserted thereinto. The second lower housing hole 306 may be composed of the second lower housing upper hole 303 having a diameter allowing the protruding ring 212 of the elastic part to be inserted thereinto, and the second lower housing lower hole 304 that is smaller than a diameter of the second lower housing upper hole 303 and allows the extension portion 232 of the lower plunger 230 to be inserted thereinto.

The second upper housing 400 has the plurality of second upper housing holes 406 formed therein and corresponding to the plurality of second lower housing holes 306, respectively. Each second upper housing hole 406 has a diameter that is smaller than a diameter of the protruding ring 212 of the elastic part allows the barrel body 211 to be inserted thereinto.

In a state in which the elastic part 240 is inserted into the second lower housing hole 306 of the second lower housing 300, the second upper housing 400 is disposed such that the second upper housing holes 406 correspond to the second lower housing holes 306, respectively, and the second upper housing 400 is then coupled to the second lower housing 300 to form the elastic part-module 900.

The second upper housing 400 and the second lower housing 300 may be coupled to other in various ways, such as a screw coupling method, a clip fastening method, or the like. (a) of FIG. 7 exemplarily shows that the second upper housing 400 and the second lower housing 300 are coupled to each other using screws 163, and (b) of FIG. 7 shows that contact part-module 800 and the elastic part-module 900 are assembled.

In the elastic part-module 900, the protruding ring 212 of the elastic part cannot be moved to the second lower housing lower hole 304 and the second upper housing hole 406, and can be moved only in the second lower housing upper hole 302 in a vertical direction.

(b) of FIG. 8 shows that the elastic part-module 900 configured as described above is coupled to the contact part-module 800 in which the contact part 250 is disposed so that the second portion 252 of the contact part can be moved in the first upper housing hole 606.

In addition, (c) of FIG. 8 shows that the elastic part-module 900 is coupled to the contact part-module 800 in which the contact part 250 is disposed so that the second portion 252 of the contact part can be moved in the first lower housing hole 606. Since this is the same as that in the description for the test socket in the first embodiment, the detailed description thereon is omitted.

In the test socket shown in (d) of FIG. 8, the positions of the second upper housing 400 and the second lower housing 300 are switched as compared to the test socket in (c) of FIG. 8.

The elastic part 240 is disposed and supported in the elastic part-module 900 formed by coupling the second upper housing 400, which is provided with the second upper housing holes 406 corresponding to the second lower housing holes 306, respectively, to a lower side of the second lower housing 300.

The second upper housing 400 is provided with the second upper housing holes 406, each of which having a diameter which allows the protruding ring 212 of the elastic part to be inserted thereinto. The second upper housing hole 406 may be composed of a second upper housing upper hole 403 having a diameter allowing the protruding ring 212 of the elastic part to be inserted thereinto, and a second upper housing lower hole 404 having a diameter which is smaller than a diameter of the second upper housing upper hole 403, but allows the extension portion 232 of the lower plunger 230 to be inserted thereinto.

The second lower housing 300 has second lower housing holes 306 formed therein and corresponding to the second upper housing holes 406, respectively. The second lower housing hole 306 has a diameter which is smaller than a diameter of the protruding ring 212 of the elastic part allows the barrel body 211 to be inserted thereinto.

The elastic part 240 in the test socket shown in (c) of FIG. 8 is assembled to the second lower housing 300 from top to bottom, whereas the elastic part 240 in the test socket shown in (d) of FIG. 8 is assembled from bottom to top bottom. Accordingly, the test socket shown in (d) of FIG. 8 has an advantage in that the assembling position can be changed compared to the test socket shown in (c) of FIG. 8.

As shown in (a) of FIG. 8, the contact part-module 800 may be mounted in an elastic part-module mounting recess 910 formed in an upper side of the elastic part-module 900. The contact part-module 800 and the elastic part-module 900 may be coupled to each other in various ways, such as a screw coupling method, a snap fit method or a fitting method or the like. (a) of FIG. 7 exemplarily depicts that the contact part-module 800 and the elastic part-module 900 may be fastened to each other using the screws 162.

The contact part-module 800 is placed in the elastic part-module mounting recess 910 such that the elastic part 240 protruding from the elastic part-module 900 is inserted into the first lower housing hole 506 of the contact part-module 800, and the contact part-module 800 is then mounted to the elastic part-module 900 using screws or the like. By mounting the contact part-module 800 to the elastic part-module 900, the test socket 1100 according to the first embodiment is completed.

(b) of FIG. 11 shows a method of replacing the contact part in a state in which the test socket is mounted to the test board.

In (b) of FIG. 11, in a state in which the test socket 1100 of the second embodiment is mounted to the test board (not shown), the contact part-module 800 may be separated from the elastic part-module 900 by unscrewing the screw 162. Separating the contact part 250 from the contact part-module 800 has been previously described, so detailed description thereon is omitted.

FIGS. 9 and 10 are views depicting a test socket 1200 according to the third embodiment of the present disclosure.

The test socket 1200 shown in FIGS. 9 and 10 utilizes the contact part-module 800 applied to the test socket 1000 of the first embodiment and the elastic part-module 900 applied to the test socket 1100 of the second embodiment. However, this embodiment differs from the first and second embodiments only in that the contact part-module 800 and the elastic part-module 900 are mounted to an intermediate housing 700.

The intermediate housing 700 is a member on which the contact part-module 800 and the elastic part-module 900 are assembled, and the intermediate housing 700 has intermediate housing holes 706 that correspond to the terminals of the device under test, respectively, and pass therethrough. An intermediate housing upper mounting recess 710 is provided in an upper side of the intermediate housing, and an intermediate housing lower mounting recess 720 is provided in a lower side of the intermediate housing.

The contact part-module 800 is mounted in the intermediate housing upper mounting recess 710, the elastic part-module 900 is mounted in the intermediate housing lower mounting recess 720, and the contact part 250 and the elastic part 240 may come into contact with each other through the intermediate housing hole 706.

(b) of FIG. 10 shows that, in the test socket configured as described above, the intermediate housing 700 is coupled with the contact part-module 800 (in which the contact part 250 is disposed) such that the second portion 252 of the contact part can be moved in the first upper housing hole 606. In addition, (c) of FIG. 10 shows that the intermediate housing 700 is coupled with the contact part-module 800 (in which the contact part 250 is disposed) such that the second portion 252 of the contact part can be moved in the first lower housing hole 506. Since this figuration is the same as that in the description for the test socket in the first embodiment, the detailed description thereon is omitted.

In a state of disposed on the intermediate housing 700, the contact part-module 800 and the elastic part-module 900 can be coupled to each other in various ways, such as a screw coupling method, a snap-fit method, a fitting method, or the like. FIG. 9 exemplarily depicts that the contact part-module 800 is fastened to the intermediate housing 700 with screws 164 and the elastic part-module 900 is fastened to the middle housing 700 with screws 165.

When the contact part-module 800 is coupled to the second lower housing 300 using a snap-fit method or a fitting method, the contact part-module 800 can be separated from the second lower housing 300 with an one-touch separating fashion, so there is an advantage that it is possible to easily separate the contact part-module 800.

(c1) of FIG. 11 shows a method of replacing the contact part in a state in which the test socket is socket mounted to the test board.

In (c1) of FIG. 11, in a state in which the test socket 1200 of the third embodiment is mounted on the test board (not shown), the contact part-module 800 may be separated from the intermediate housing 700 by unscrewing the screw 164. Separating the contact part 250 from the contact part-module 800 has been previously described, so detailed description thereon is omitted.

(c2) of FIG. 11 shows separating the elastic part-module 900 from the test socket 1200 of the third embodiment. It is possible to separate the elastic part-module 900 from the intermediate housing by unscrewing the screws 165.

In the present disclosure, the first upper housing 600, the first lower housing 500, the second upper housing 400, the second lower housing 300, and the middle housing 700 may be formed of metal material such as synthetic resin, aluminum, or the like. When the first upper housing 600, the first lower housing 500, the second upper housing 400, the second lower housing 300, and the middle housing 700 may be formed of metal material, at least a peripheral portion of each of the first upper housing hole 606, the first lower housing hole 506, the second upper housing hole 406, the second lower housing hole 306 and the intermediate housing holes 706, which may come into contact with the socket pin 200, may be coated with an insulating layer. This insulating layer can prevent the problem of the socket pin 200 being short-circuited with the first upper housing 600, the first lower housing 500, the second upper housing 400, the second lower housing 300, and the middle housing 700.

As described above, the test sockets 1100 and 1200 of the second and third embodiments are characterized in that the contact parts of the socket pins are assembled into the contact part-module and the elastic parts are assembled into the elastic part-module, so all the socket pins may be modularized.

In the test sockets 1100 and 1200 of the second and third embodiments of the present disclosure, since the contact parts 250 are modularized into the contact part-module 800 and the elastic parts 240 including the lower plungers can be modularized into the elastic part-module 900, by mounting the contact part-module 800 to the elastic part-module 900 or by coupling the contact part-module 800 and the elastic part-module 900 to the upper and lower sides of the intermediate housing 700, respectively, the test socket may be easily completed, and as a result, the time for assembling the test socket may be significantly shortened.

In addition, in the test sockets 1100 and 1200 of the second and third embodiments of the present disclosure, since the contact parts 250 and the elastic parts 240 are separately modularized, if the spare contact part-module 800 or elastic part-module 900 is prepared in advance, when some of the contact parts or some of the elastic parts are damaged, the module containing the damaged parts can be immediately replaced with the spare module and the test can be performed with the test socket having the newly mounted module, so the test downtime can be minimized. In addition, when the part constituting the module is damaged, the damaged part can be replaced with a new one at a separate location and time, thereby greatly improving the efficiency of the testing process.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims. The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A test socket configured to bring terminals of a device under test into contact with electrode pads of a test board, which generates a test signal, to perform an electrical test for the device under test, comprising:

a first upper housing having first upper housing holes, which are formed therein and correspond to the terminals of the device under test, respectively;

a first lower housing having first lower housing holes, which are formed therein and correspond to the first upper housing holes, respectively;

a second lower housing having second lower housing holes, which are formed therein and correspond to the first lower housing holes, respectively; and a plurality of socket pins, each of which including an elastic part in which a lower plunger may be elastically supported in a cylindrical barrel body to come into contact with the electrode pad, and a contact part formed as separate part from the elastic part and divided into a first portion capable of coming into contact with the terminal of the device under test and a second portion coming into contact with the elastic part and having a diameter greater than that of the first portion;

wherein the elastic part is disposed and supported in the second lower housing hole, and the contact part is disposed and supported in a contact part-module formed by coupling the first lower housing to a lower side of the first upper housing.

2. The test socket of claim 1, wherein the contact part-module is mounted to the second lower housing.

3. The test socket of claim 1, wherein the first upper housing hole comprises a first upper housing lower hole having a diameter allowing the second portion to be inserted thereinto, and a first upper housing upper hole having a diameter which is smaller than that of the second portion and allows the first portion to be inserted thereinto, and the first lower housing hole has a diameter which is smaller than that of the second portion and allows the barrel body to be inserted thereinto.

4. The test socket of claim 1,
wherein the first upper housing hole has a diameter which is smaller than that of the second portion and allows the first portion to be inserted thereinto,
wherein the first lower housing hole comprises a first lower housing upper hole having a diameter allowing the second portion to be inserted thereinto, and a first lower housing lower hole having a diameter which is smaller than that of the second portion and allows the barrel body to be inserted thereinto.

5. The test socket of claim 3, wherein the elastic part comprises a protruding ring protruding from the barrel body at a lower end portion of the barrel body, and the elastic part is disposed and supported in an elastic part-module formed by coupling a second upper housing, which is provided with second upper housing holes corresponding to the second lower housing holes, respectively, to an upper side of the second lower housing.

6. The test socket of claim 5, the contact part-module is mounted to the elastic part-module.

7. The test socket of claim 5, wherein the second lower housing hole has a diameter allowing the protruding ring to be inserted thereinto, and the second upper housing hole has a diameter which is smaller than a diameter of the protruding ring and allows the barrel body to be inserted thereinto.

8. The test socket of claim 3, wherein the elastic part comprises a protruding ring protruding from the barrel body at a lower end portion of the barrel body, and the elastic part is disposed and supported in an elastic part-module formed by coupling a second upper housing, which is provided with second upper housing holes corresponding to the second lower housing holes, respectively, to a lower side of the second lower housing.

9. The test socket of claim 8, wherein the second upper housing hole has a diameter allowing the protruding ring to be inserted thereinto, and the second lower housing hole has a diameter which is smaller than that of the protruding ring and allows the barrel body to be inserted thereinto.

10. The test socket of claim 5, wherein the test socket further comprises an intermediate housing having intermediate housing holes, each of the intermediate housing holes being formed therein and corresponding to the terminal of the device under test, and wherein the contact part-module is mounted to an upper side of the intermediate housing, the elastic part-module is mounted to a lower side of the intermediate housing, and the contact part comes into contact with the elastic part through the intermediate housing hole.

* * * * *